US006604863B2

(12) United States Patent
Trzecieski

(10) Patent No.: US 6,604,863 B2
(45) Date of Patent: Aug. 12, 2003

(54) ACTUATOR MECHANISM FOR PRECISION ALIGNMENT OF OPTICAL COMPONENTS

(76) Inventor: Mike Trzecieski, 3-105 Clarence Street, Ottawa, Ontario (CA), K1N 5P5

( * ) Notice: Subject to any disclaimer, the term of this patent is extended or adjusted under 35 U.S.C. 154(b) by 50 days.

(21) Appl. No.: 09/881,775

(22) Filed: Jun. 18, 2001

(65) Prior Publication Data

US 2003/0026547 A1 Feb. 6, 2003

(51) Int. Cl.[7] .................................................. G02B 6/38
(52) U.S. Cl. .............................. 385/57; 385/25; 385/52
(58) Field of Search ............................... 385/15, 16, 25, 385/50, 52, 57

(56) References Cited

U.S. PATENT DOCUMENTS

| | | | | |
|---|---|---|---|---|
| 4,193,662 A | * | 3/1980 | Hara ........................... 385/18 |
| 5,000,534 A | * | 3/1991 | Watanabe et al. .............. 385/16 |
| 5,031,994 A | * | 7/1991 | Emmons ..................... 385/114 |
| 5,039,193 A | * | 8/1991 | Snow et al. ................... 385/25 |
| 5,105,403 A | * | 4/1992 | Kando et al. ........... 369/112.14 |
| 5,127,084 A | * | 6/1992 | Takahashi ................... 385/114 |
| 5,252,924 A | * | 10/1993 | Sakurai et al. ............... 335/113 |
| 6,463,190 B1 | * | 10/2002 | Kato et al. ..................... 385/16 |

* cited by examiner

*Primary Examiner*—Robert H. Kim
*Assistant Examiner*—Richard Kim
(74) *Attorney, Agent, or Firm*—Freedman & Associates

(57) ABSTRACT

A multi axis optical component actuator mechanism is disclosed using a plurality of electromagnetic coil actuators and a plurality of magnetic stator assemblies for aligning an optical component in a plurality of axes. In the preferred embodiment the plurality of electromagnetic coils are rigidly coupled together to a carriage and the optical component. The carriage is free to move within a plurality of magnetic flux air gaps defined within a plurality of magnetic stator assemblies in response to a plurality of control signals having a magnitude and polarity. Advantageously the disclosed multi-axis optical component actuation mechanism has a high frequency response as well as inexpensive cost of manufacturing.

26 Claims, 10 Drawing Sheets

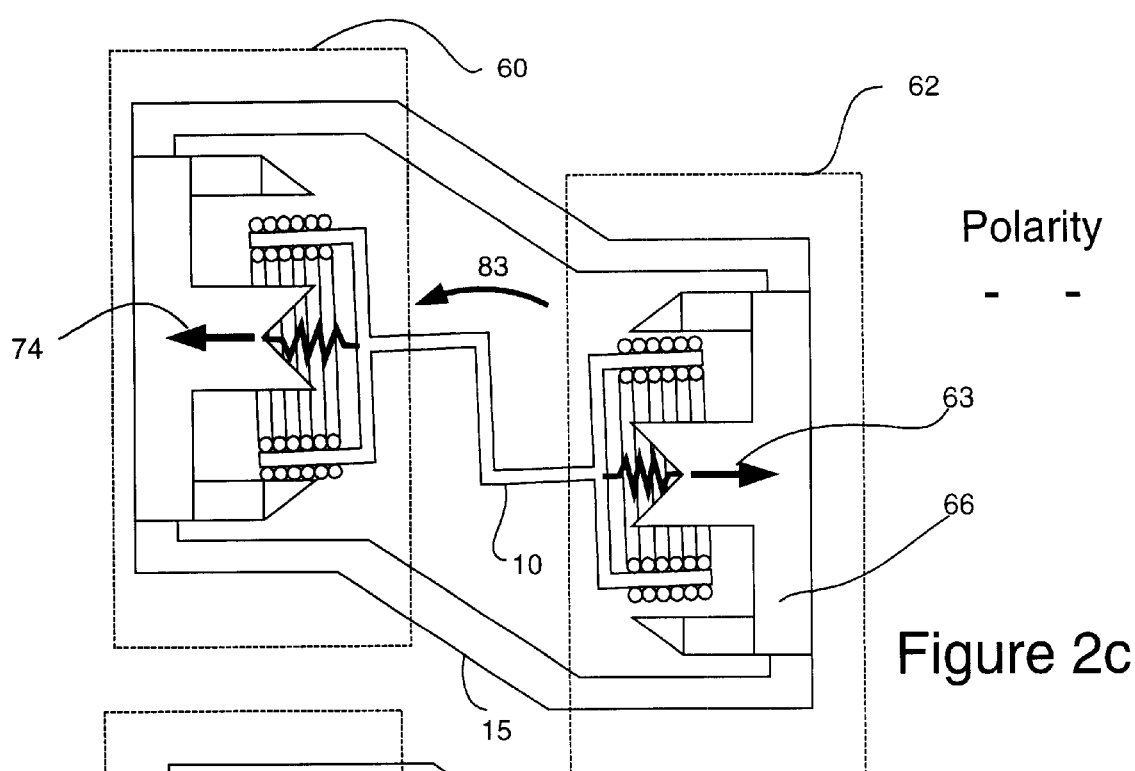
Figure 2c
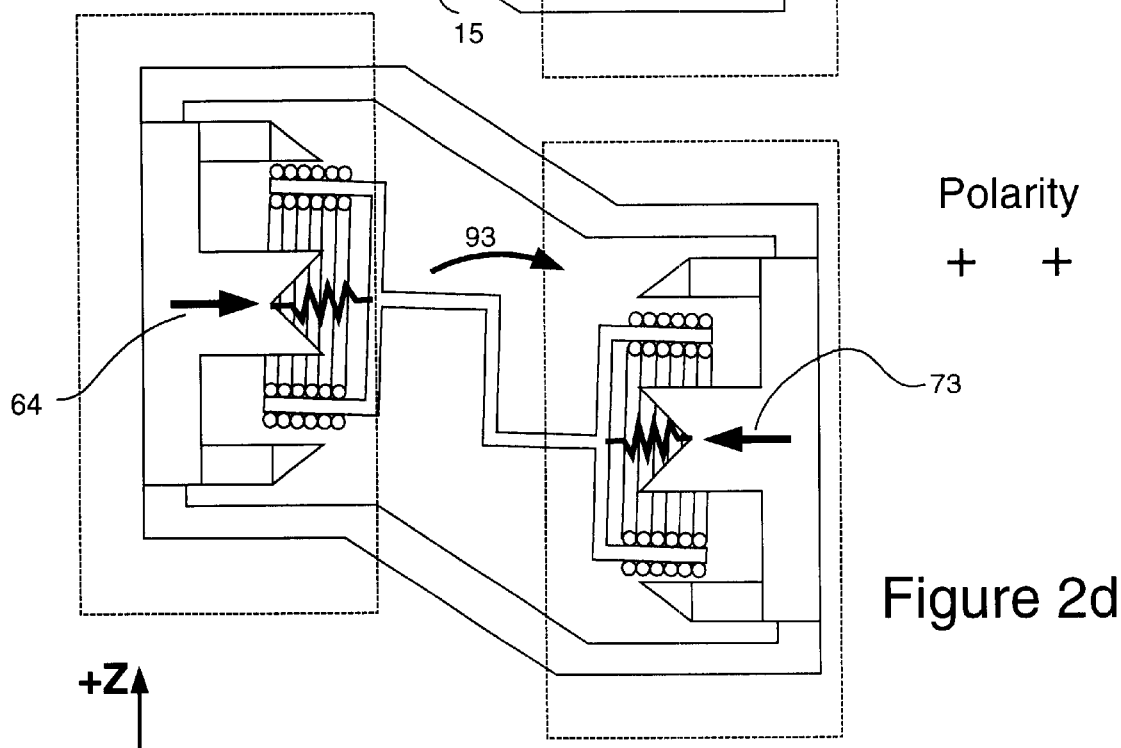
Figure 2d
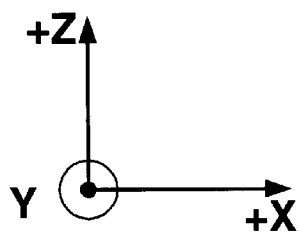

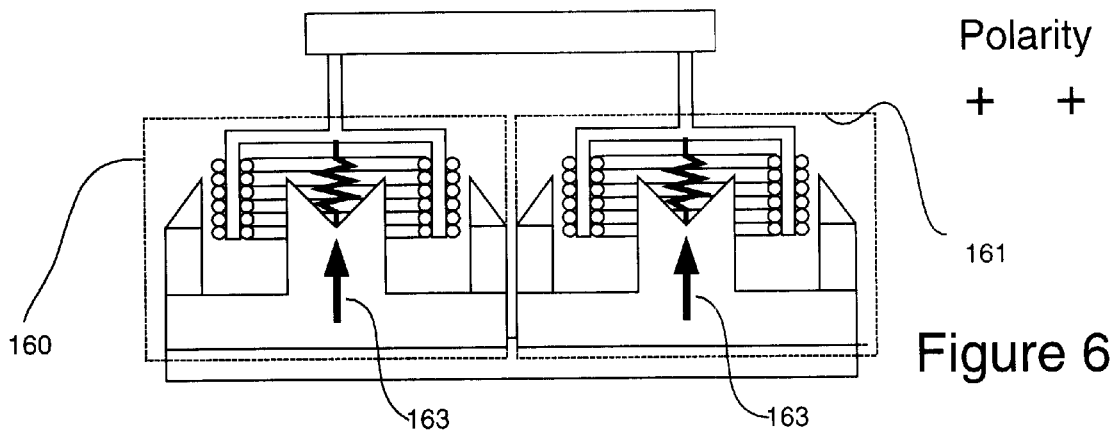
Polarity
+ +
Figure 6a
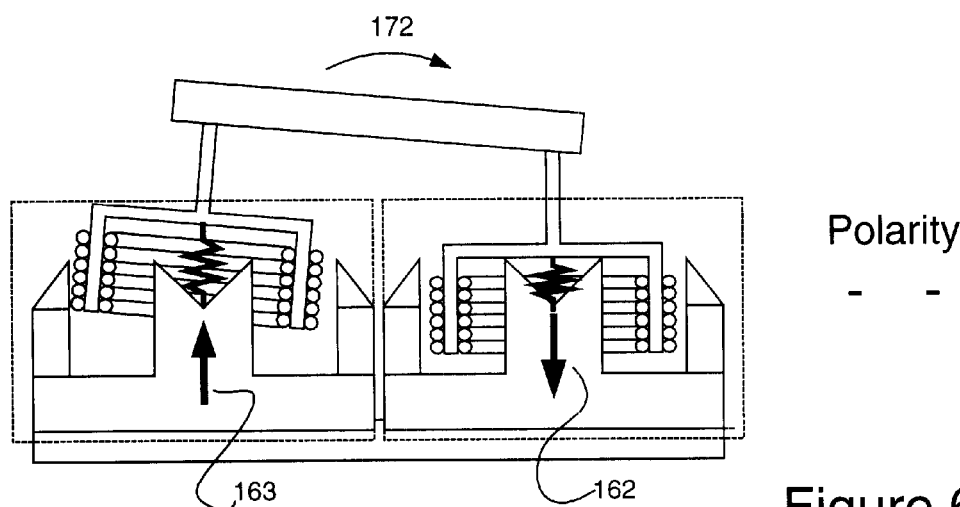
Polarity
− −
Figure 6b
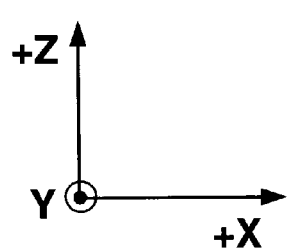

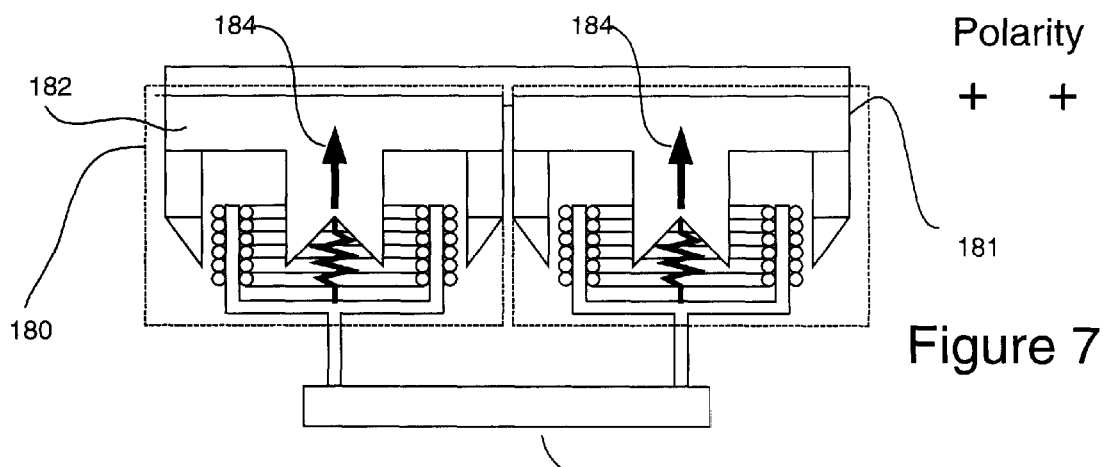
Figure 7a
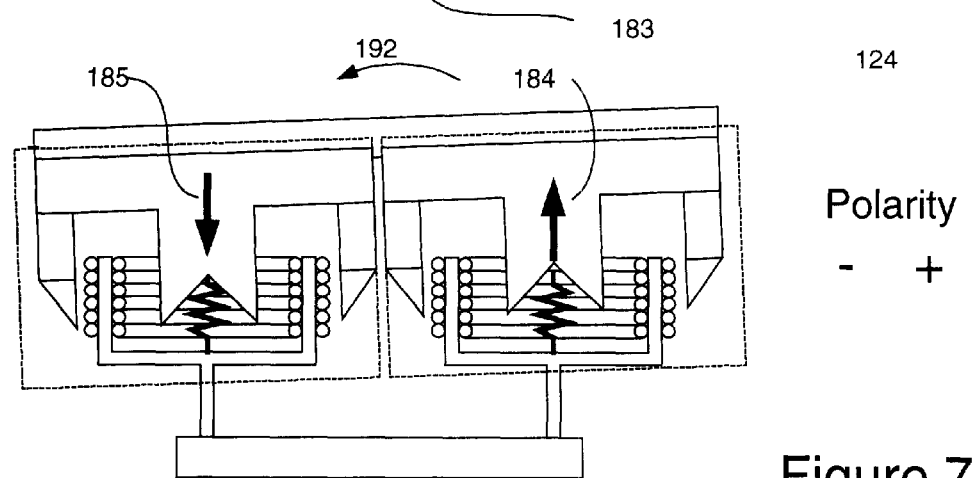
Figure 7b
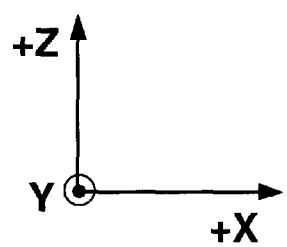

ACTUATOR MECHANISM FOR PRECISION ALIGNMENT OF OPTICAL COMPONENTS

FIELD OF THE INVENTION

This invention relates to the field of fiber optic component assembly and more specifically to the area of actuator design for use in alignment of fiber optic components.

BACKGROUND OF THE INVENTION

In order to provide cheaper optical network devices the manufacturing costs associated with the assembly of each optical network device must decrease. During optical network device assembly a fiber is attached to the device to provide light to or from the device.

Conventional means of assembling optical network components utilize slow and expensive high precision mechanical 3 axis positioning stages. Typically the Z-axis determines the focusing of the optical system and the X and Y directions ensure capturing of the light as the optical component is physically brought in closer to the optical network device during assembly.

In some cases 5 or 6 axis positioners are used, where the added angular degrees of freedom result in better alignment. Positioning stages like these are able to compensate for angle and position thereby allowing for further reduction in optical losses. A drawback of using conventional 5 or 6 axis stages is that they are more difficult to align than three axis stages and have a significantly higher cost.

Typically, the aforementioned positioning stages offer high precision, high repeatability, high rigidity but suffer drawbacks such as alignment speed and cost of acquisition. It would therefore be advantageous to offer an inexpensive positioning stage capable of fast actuation as well as sufficient motion in all directions to allow for coarse and fine positioning of an optical component for the purpose of optical alignment.

Alignment is usually performed manually subject to human error and human operator speed. Automated systems exist but are generally based on manual positioning actuator design and as such suffer many similar drawbacks.

It is therefore an object of this invention to provide a fast and inexpensive six-axis optical component actuation mechanism capable of high frequency alignment.

SUMMARY OF THE INVENTION

In accordance with the invention there is provided an alignment mechanism for aligning a component in two axes, comprising:
  at least two magnetic stator assemblies, each comprising a magnetic stator for providing a magnetic flux;
  at least two electromagnetic coil assemblies, each comprising an electromagnetic coil for interacting with the magnetic flux, the electromagnetic coil assembly in spaced relation to the magnetic stator forming a gap therebetween;
  a carriage mounted to two assemblies from the at least two electromagnetic coil assemblies and the at least two magnetic stator assemblies;
  a control circuit for providing a control signal to the electromagnetic coil to displace it a controllable distance relative to the magnetic stator assembly; and,
  wherein the carriage is controllably movable in rotation about and translation along at least two different axis.

In accordance with another embodiment of the invention there is provided a method of positioning a component in a rotational direction about a first axis and in a translational direction parallel to a second other axis, comprising the step of:
  varying the intensity and polarity of a control signal applied to each of a pair of electromagnetic actuators fixed to a same carriage at two different locations thereon to control the magnitude and direction of displacement of the carriage along the second other axis and to control the magnitude and direction of rotation of the carriage along about the first axis wherein the displacement and rotation is relative to a pair of magnets each proximate one electromagnetic actuator from the pair of electromagnetic actuators.

BRIEF DESCRIPTION OF THE DRAWINGS

The invention will now be described with reference to the drawings in which:

FIG. 6 illustrates a variation of the dual electromagnetic coil actuator and method of control;

FIG. 7 illustrates another variation of a fixed electromagnetic coil stator dual electromagnetic coil actuator and method of control.

DETAILED DESCRIPTION OF THE INVENTION

In the below description directions are arbitrarily selected and are indicated as directions of travel parallel to an axis for linear axes and rotating about an axis for axes of rotation.

There are many fields in which alignment is performed automatically. For instance in the assembly of fiber optic components alignment systems are utilized to position the components with respect to each other to maximize the throughput of light.

In fiber optic network component assembly it is preferable to have an actuator mechanism that is capable of positioning the optical component at high speeds. It is also preferable to have a multi-axis actuator that is inexpensive such that the overall cost of purchasing and maintenance does not adversely affect profit margins. A system developed around an electromagnetic coil actuator mechanism satisfies both of the above stated requirements.

A multi axis electromagnetic actuator is proposed in U.S. Pat. No. 6,066,998 entitled "Magnetic Actuator with Long Travel in one Direction" in the name of Trumber et al. This patent discloses an actuator system having long travel in one direction and much smaller travel for fine-tuning in other directions. This actuator utilizes a magnetic core that moves within a magnetic yoke and coil assembly. It has a large range of motion in one direction and a smaller range of motion in the others.

It is obvious that moving a magnetic assembly is not advantageous in that it does not allow for a high frequency response because of the mass of the magnetic core. In order to achieve coarse and fine positioning of any component it would be advantageous to have long actuator travel in all three translation directions, as well as the ability to rotate a workpiece about three different axes for angular alignment.

Figure 1:
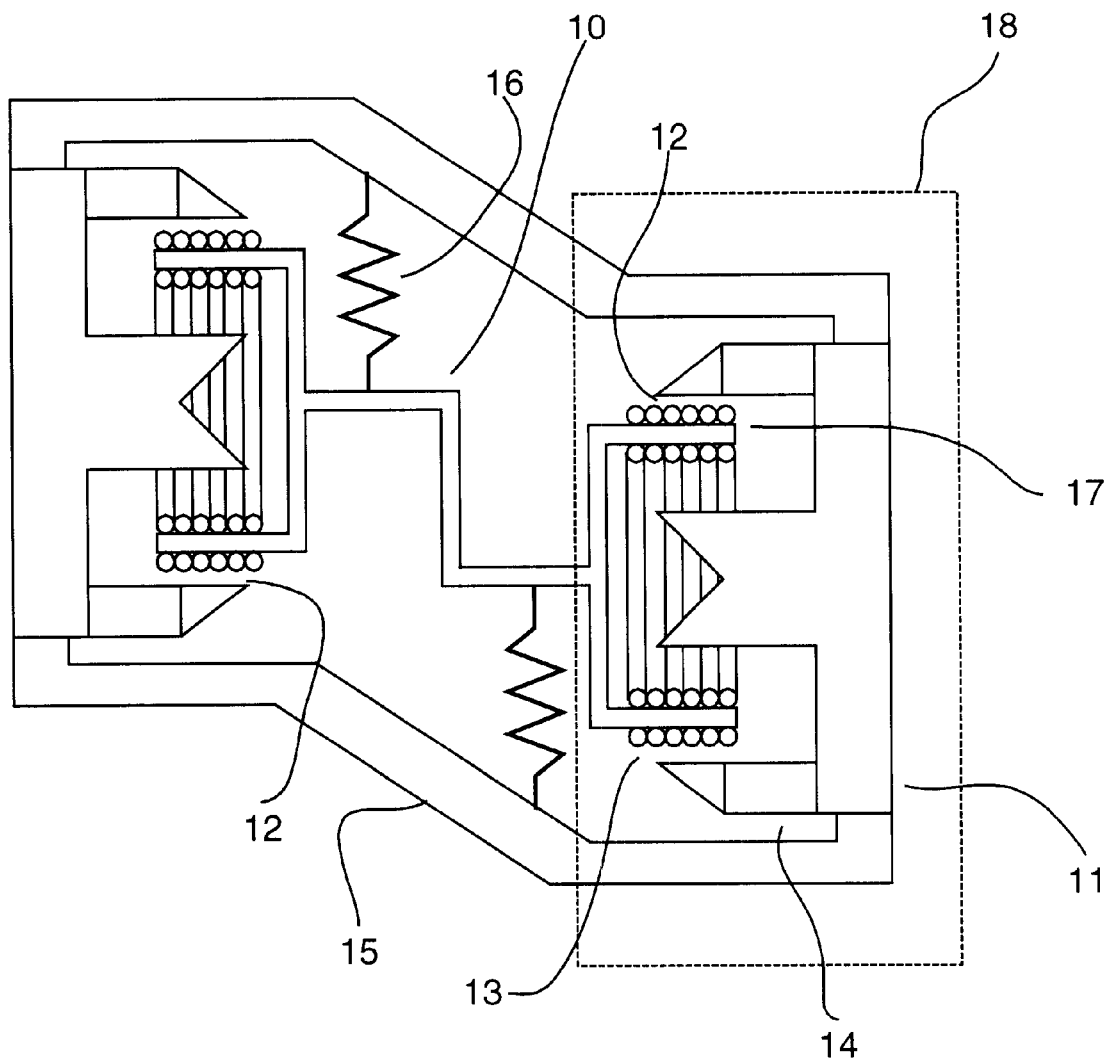
FIG. 1 is a cross sectional side view of a flexibly mounted dual electromagnetic coil actuator for dual axis component alignment.
Figure 1:
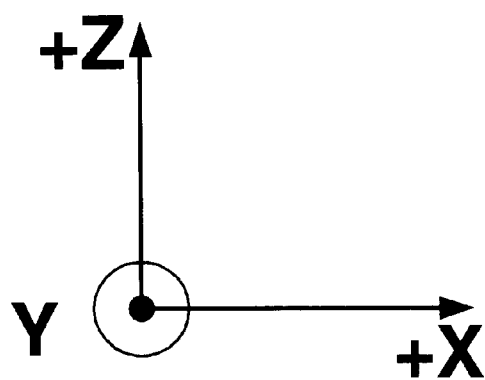

Referring to FIG. 1, flexibly mounted dual electromagnetic coil actuator mechanism is shown in an "S" orientation. The magnetic stator assembly 11 comprises a high permittivity ferrous material having a gap end and a closed end, with a permanent ring magnet 14 disposed around the outside portion of the magnetic stator assembly 11 between the gap end and the closed end. The architecture of the magnetic stator assembly 11 is chosen to focus the magnetic flux generated by the permanent ring magnet through the gap 12, focussing the magnetic flux within the gap 12 to interact with a portion of an electromagnetic coil 13 disposed therein. The electromagnetic coil has electrical windings 17 for interacting with the magnetic field within the gap 12, in response to a control signal. A single electromagnetic coil actuator 18 comprises a single electromagnetic coil and magnetic stator assembly.

Two magnetic stator assemblies 11 are fixedly coupled to a same housing 15 in spaced relation with gap ends approximately facing each other. Disposed within the two magnetic stator assemblies are two electromagnetic coil assemblies 13, coupled to a carriage 10. The magnetic stator assemblies 11 are facing each other along the X direction, offset along the Z direction, and in the same XZ plane. The two electromagnetic coil assemblies are positioned in spaced relation to the stators within each gap 12. Both electromagnetic coil assemblies are disposed for motion along the X direction, and offset one from the other in the Z direction. Preferably, the stators are within the XZ plane.

The carriage 10 is flexibly mounted to the housing along and/or about, for example, four axes using two or more flexible coupling springs 16 coupled to the housing 15. The two flexible coupling springs are oriented for maintaining the carriage orientation along or about any axes for which a control mechanism is not present. Alternatively, the springs act to provide additional support along or about axes wherein orientation is controlled. The two flexible coupling springs suspend the carriage 10 within the gaps defined within both magnetic stator assemblies 11. All portions of the carriage 10 and electromagnetic coil assemblies 13 are preferably not in physical contact with any part of either of the magnetic stator assemblies 11.

The carriage is controllably movable in rotation about the Y-axis and translation along the X direction in dependence upon a control signal from a control circuit for providing the control signal to the electromagnetic coils to displace the carriage in a controllable manner within each gap relative to the stator assemblies.

Applying an electrical potential to the electrical windings 17 of the electromagnetic coil 13 results in a magnetic field being emitted from the coil. The magnetic field emitted by the electromagnetic coil 13 interacts with the magnetic flux field within the gap 12. This results in a force applied to the coil and stator directing the carriage along the X-axis. Depending upon the intensity and polarity of the control signal applied to each electromagnetic coil the resultant force will either displace the carriage along the X-axis, or cause a rotation of the carriage about the Y-axis. The force generated by the two electromagnetic coil actuator assemblies on the carriage is strong enough to overcome components of the axial force imposed on the carriage as a result of the resilient mounting. Of course during design, the flexible mounting is selected to allow operation in accordance with the above description FIG. 2 shows a plurality of diagrams for use in illustrating a method of controlling the flexibly mounted dual electromagnetic coil actuator mechanism shown in FIG. 1 to obtain both X-axis translation of the carriage, as well as rotation about the Y-axis, or combinations thereof.

Figure 2A:
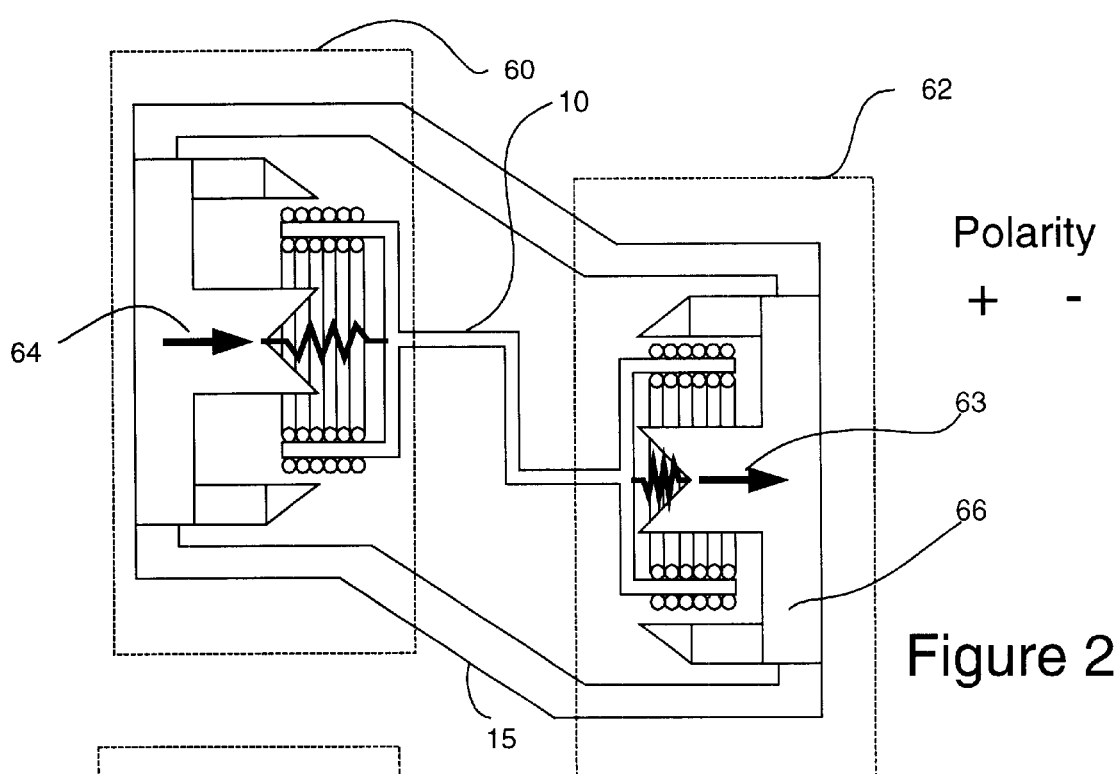
FIG. 2 is several cross sectional views similar to that of FIG. 1 but showing motion of the flexibly mounted dual electromagnetic coil actuator in response to an applied control signal.

In FIG. 2a, assuming two identical electromagnetic coil actuator assemblies as part of the alignment mechanism, a positive polarity control signal is applied to the first electromagnetic coil actuator 60, and a negative polarity control signal is applied to the second electromagnetic coil actuator 62. The positive polarity control signal on the first electromagnetic coil actuator 60 creates a first force 64 on the carriage 10 in a positive X direction, away from the first stator assembly 64. The negative polarity control signal on the second electromagnetic coil actuator assembly 62 creates a second force 63 on the carriage in a positive X direction, towards the second stator assembly 66. This results in a net displacement of the carriage 10 in a positive X direction in response to the first 64 and second 63 forces.

Figure 2B:
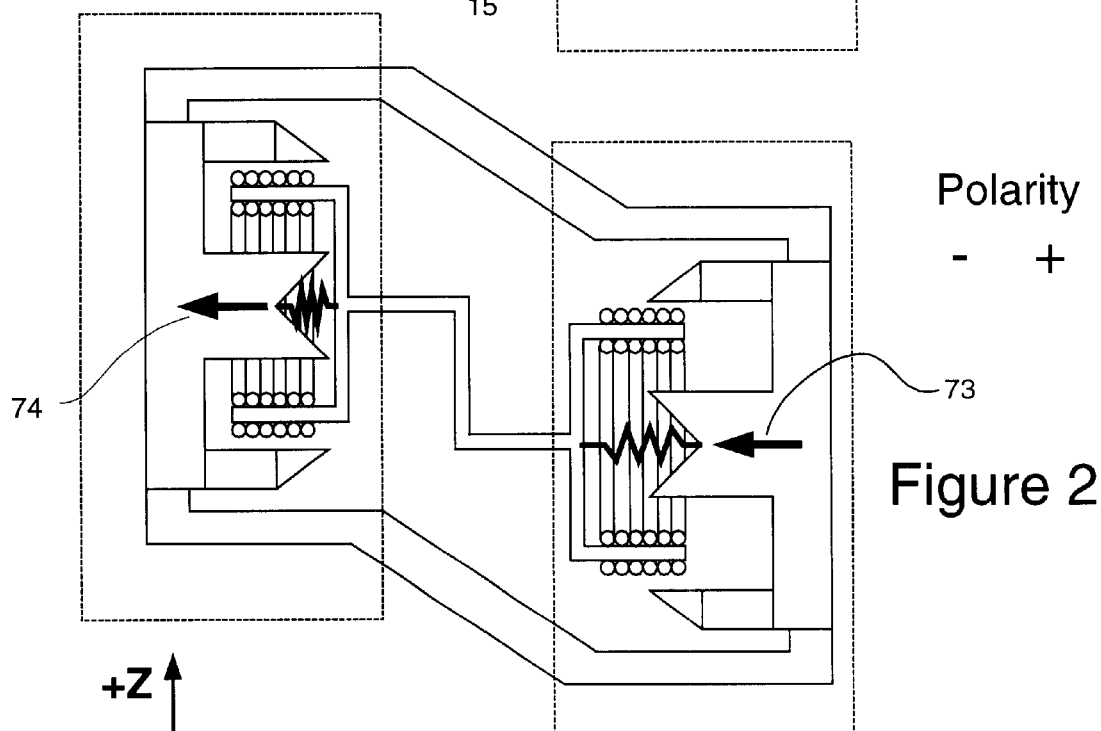

In FIG. 2b, assuming two identical electromagnetic coil actuator assemblies as part of the alignment mechanism, a negative polarity control signal is applied to the first electromagnetic coil actuator 60, and a positive polarity control signal is applied to the second electromagnetic coil actuator 62. The negative control signal on the first electromagnetic coil actuator assembly creates a first force 74 on the carriage in a negative X direction, towards the first stator assembly 65. The positive polarity control signal on the second electromagnetic coil actuator assembly 62 creates a second force 73 on the carriage 10 in a negative X direction, away from the second stator assembly 66. This results in a net displacement of the carriage 10 in negative X direction in response to the first 74 and second forces 73.

In FIG. 2c, assuming two identical electromagnetic coil actuator assemblies as part of the alignment mechanism, a negative polarity control signal is applied to the first electromagnetic coil actuator 60, and a negative polarity control signal is applied to the second electromagnetic coil actuator 62. The negative polarity control signal on the first electromagnetic coil actuator assembly creates a first force 74 on the carriage 10 in a negative X direction, towards the first stator assembly 65. The negative polarity control signal on the second electromagnetic coil actuator assembly 62 creates a second force 63 on the carriage 10 in a positive X direction, towards the second stator assembly 66. This results in a net rotation of the carriage in a counter clockwise (CCW) direction 83 about the Y-axis in response to the first 74 and second 63 forces acting on the carriage 10.

In FIG. 2d, assuming two identical electromagnetic coil actuator assemblies as part of the alignment mechanism, a positive polarity control signal is applied to the first electromagnetic coil actuator 60, and a positive polarity control signal is applied to the second electromagnetic coil actuator 62. The positive polarity control signal on the first electromagnetic coil actuator assembly 60 creates a first force 64 on the carriage in a positive X direction, away from the first stator assembly 65. The positive polarity control signal on the second electromagnetic coil actuator assembly 62 creates a second force 63 on the carriage in a negative X direction, away from the second stator assembly 66. This results in a net rotation of the carriage in a clockwise (CW) direction 93 about the Y-axis in response to the first 64 and second 73 forces acting on the carriage 10.

Using combinations of control signal polarity and control signal intensity applied to each electromagnetic coil actuator assembly results in an approximately predetermined combination of translation and rotation of the carriage 10 in response to the control signal. Each gap 12 limits the motion of the carriage within predetermined limits as defined by the dimensions of the gap 12. Table 1 summarizes the resultant movement of the carriage in response to magnitude and polarity of applied control signals to each of the electromagnetic coil actuator assemblies 60, 62.

| Control Signal Polarity Applied to electromagnetic Coil Actuator | | |
|---|---|---|
| 60 | 62 | Carriage Displacement |
| + | − | translation +X |
| − | + | translation −X |
| − | − | rotation CCW about Y |
| + | + | rotation CW about Y |

Table 1 Dual axis carriage movement in response to control signal polarity applied to each electromagnetic coil actuator as part of the dual axis alignment mechanism having magnetic stator assemblies fixed to a housing.

Figure 3:
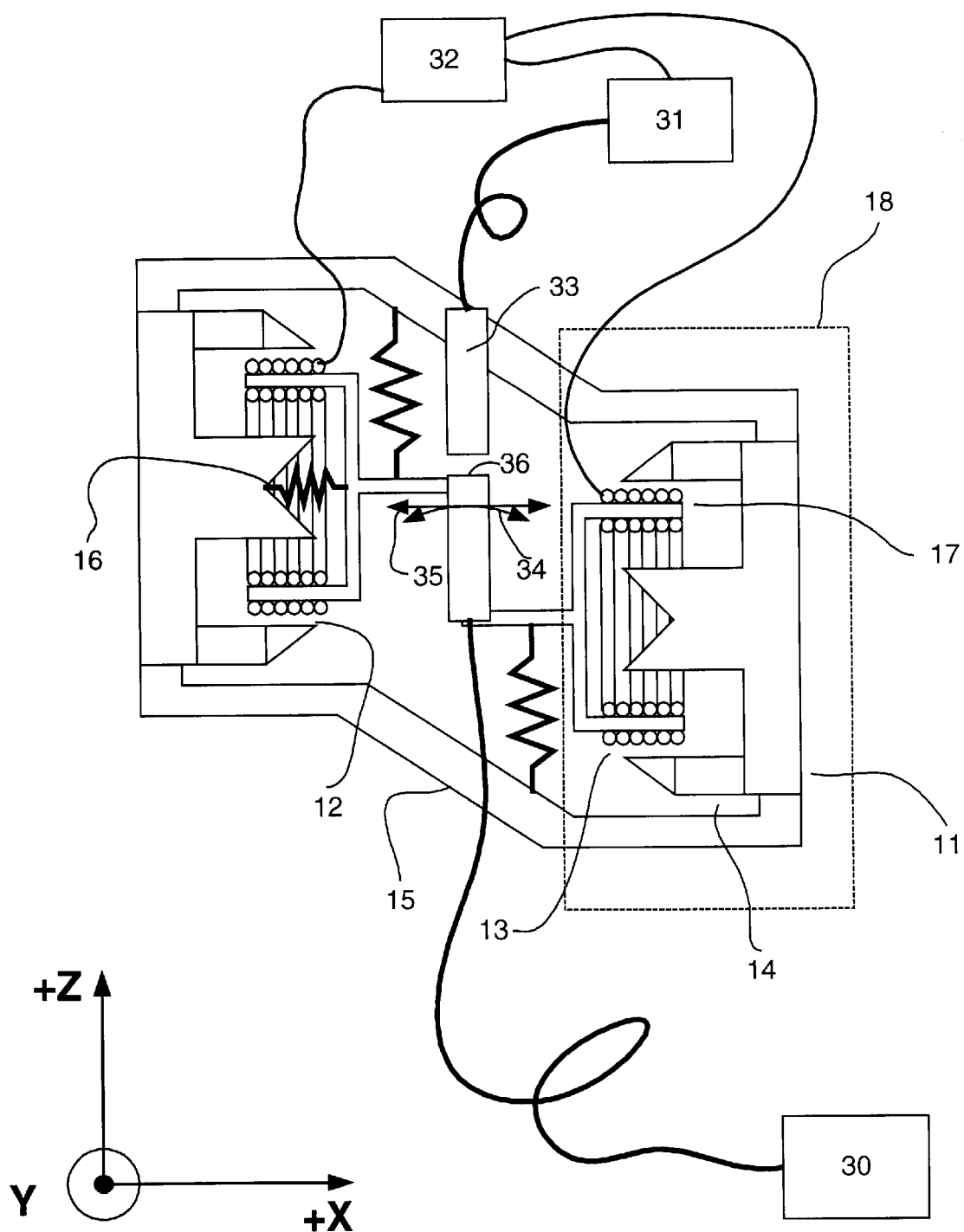
FIG. 3 is a cross sectional diagram of a dual electromagnetic coil actuator shown in experimental setup for aligning an optical component with two degrees of freedom.

In FIG. 3, an experimental alignment set-up using the flexibly mounted dual electromagnetic coil actuator mechanism for dual axis alignment of a first optical component 33 to a second other optical component 36 in response to applied control signals is shown. The experimental set-up comprises the following: a light source 30, a first optical component 33 coupled to a housing 15, a second optical component 35 coupled to the carriage 10 of a flexibly mounted dual electromagnetic coil actuator mechanism, a photodetector 31, and a control circuit 32 for controlling each of the electromagnetic coils within the flexibly mounted dual electromagnetic coil actuator mechanism.

Light from the light source 30 illuminates the first optical component 33 and passes through the optical component into a second optical component 36 and passes through the second optical component to the photodetector 31. The photodetector 31, in response to the light intensity, generates a photocurrent and provides it to the control circuit 32. The control circuit 32 receives the photocurrent and generates an alignment signal therefrom for initiating the alignment process.

Applying a control signal to the dual axis alignment mechanism results in displacement of the carriage and optical component along the X-axis 35, or rotation of the carriage and optical component about the Y-axis 34. The control circuit 32 positions the optical component 36 using the flexibly mounted dual electromagnetic coil actuator mechanism in two different states, along the predetermined controllable axes, such that a different photocurrent is received by the control circuit in each of the two states. The control circuit then provides a control signal for effecting a higher photocurrent to the flexibly mounted dual electromagnetic coil actuator mechanism. In dependence thereon, the optical component is moved in the direction of the higher photocurrent. The alignment process repeats until a point is reached wherein the optical component is at or near a position of maximum photocurrent on the photodetector; this being indicative of the optical component being aligned within the optical path. Accordingly, when used in the present disclosure the term "aligned" refers to a position wherein changing the magnitude or polarity of the control signal results in a decrease in optical intensity at the detector.

Figure 4:
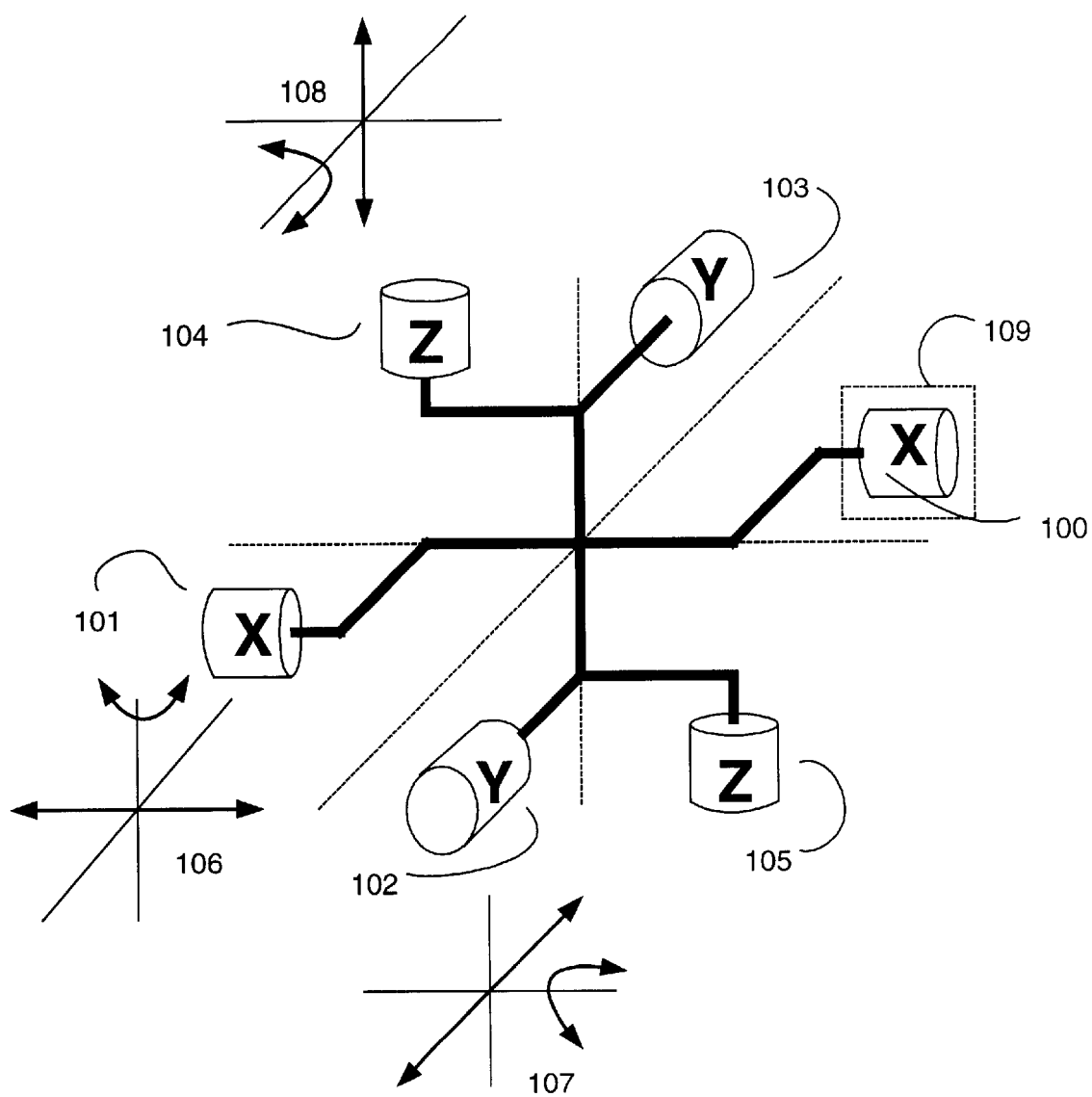
FIG. 4 is a diagram of the preferred embodiment six-axis electromagnetic coil alignment mechanism.

FIG. 4 illustrates the preferred embodiment of the invention. In the preferred embodiment three dual electromagnetic coil actuator mechanisms, as shown in FIG. 1, and slight variations thereof, are coupled together at their center axes. This results in an assembly wherein six electromagnetic coils 13 are mounted to a single carriage 40, where each of the six electromagnetic coils is part of an electromagnetic coil actuator 109. As such, it will be evident from the drawings, moving of each coil pair in an analogous fashion to the above described embodiment results in an alignment mechanism with six degrees of freedom.

Each of the magnetic stator assemblies is coupled to a housing (not shown) such that the magnetic stator assemblies are stationary therein. The six-axis alignment mechanism allows for controllable movement of the carriage 40 in three orthogonal and three rotational directions. Control of each of the three dual axis alignment mechanisms is disclosed in Table 1, and in combination, results in controllable movement of the carriage 40 for all six degrees of freedom.

X Axis

Applying a control signal to the dual axis alignment mechanism comprising electromagnetic coil actuators 100 and 101 results in either linear translation of the carriage along the X direction 106, or rotation about the Z axis 106, or a combination thereof 106, depending upon the intensity and polarity of the control signal applied to each of the electromagnetic coil actuators 100 and 101.

Y Axis

Applying a control signal to the dual axis alignment mechanism comprising electromagnetic coil actuators 102 and 103 to cause linear translation of the carriage along the Y direction 107, or rotation about the X axis 107, or a combination thereof 107, depending upon the intensity and polarity of the control signal applied to each of the electromagnetic coil actuators 102 and 103.

Z Axis

Applying a control signal to the dual axis alignment mechanism comprising electromagnetic coil actuators 104 and 105 to cause linear translation of the carriage along the Z direction 108, or rotation about the Y axis 108, or a combination thereof 108, depending upon the intensity and polarity of the control signal applied to each of the electromagnetic coil actuators 104 and 105.

In the preferred embodiment shown in FIG. 4, the carriage 40 need not be resiliently mounted to the housing as in FIG. 1. In FIG. 1 the carriage requires resilient mounting because it is only controllable in two axes. For the dual axis alignment mechanism to be useable in an alignment system, such as that shown in FIG. 3, it requires resilient mounting in the other four axes. Alignment in these directions is known such that the mounting prevents misalignment of the component in these axes. If no predetermined limits were imposed on the carriage in these four directions then it would be difficult for the alignment process to obtain repeatable results. Resiliently mounting the carriage allows for predictable motion of the carriage along the four axes that are not actively controlled, and as such, enables alignment of the component in the two controllable axes.

In the preferred embodiment, the carriage is constrained in all six axes within predetermined limits by the six actuators. Using various combinations of intensity and polarity for each of the control signals applied to each of the six electromagnetic coil actuator assemblies 109 results in a controllable movement of the carriage in all six axes. The motion of the carriage in all six directions is limited by the predetermined limits imposed on the carriage by each of the gaps 12. Having each of the electromagnetic coil actuator assemblies fully controllable obviates the need for resilient mounting of the carriage 40. That said, it may be advantageous to provide some resilient mounting to facilitate support of the optical component.

Applying a control signal of an appropriate intensity and polarity to each dual axis alignment mechanism results in the carriage 40 and optical component coupled thereto to magnetically suspend within the six gaps 12. Not having the carriage fixedly mounted results in faster carriage response to a varying control signal applied to each dual electromagnetic coil actuator mechanism. As a result it allows for a higher frequency response of the optical alignment system. Higher frequency response is considered advantageous in alignment systems as it allows for faster operation and for increased stability in a purely dynamic system.

The component is mounted anywhere to the carriage 40 in any orientation, in dependence upon the desired movement of the component. In the case of an optical fiber the fiber can be mounted along one of the axes of the carriage 40. Of course, the component must be aligned such that within the predetermined possible motion of the carriage, accurate alignment is possible.

Optionally the carriage is resiliently mounted to the housing for restricting motion about or along one or more axis.

FIG. 5 illustrates a dual electromagnetic coil actuator mechanism having magnetic stator assemblies are part of the carriage with electromagnetic coils coupled to a rigid housing. In this embodiment each dual electromagnetic coil actuator mechanism comprises at least two magnetic stator assemblies wherein each magnetic stator assembly comprises a magnetic stator for providing a magnetic flux, and at least two electromagnetic coil assemblies, each comprising an electromagnetic coil for interacting with the magnetic flux. The electromagnetic coil assembly is in a spaced relation to the magnetic stator assembly forming a gap therebetween, and a carriage is mounted to the at least two magnetic stator assemblies. The electromagnetic coil assemblies are mounted to a housing 124.

Of course, since stator assemblies are typically more heavy than coil assemblies, such an embodiment is optimized by providing some support to the stator assemblies to reduce the work necessary to move same. For example, the stator assemblies can be mounted by springs or other elastic material to the housing such that most of the weight of the stators is supported by the springs or elastic material thereby reducing the energy required to move the stators for aligning the components.

Figure 5A:
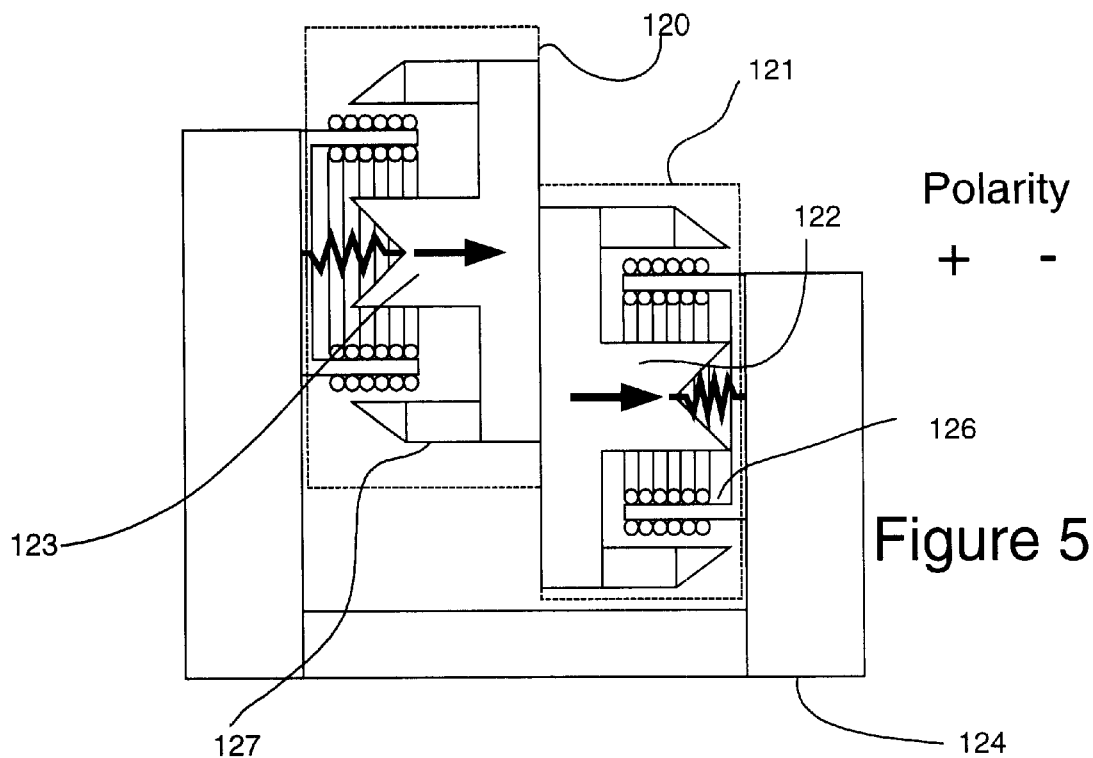
FIG. 5 is a diagram of a fixed electromagnetic coil stator dual electromagnetic coil actuator and method of control.

In FIG. 5a, assuming two identical electromagnetic coil actuator assemblies as part of the alignment mechanism, a positive polarity control signal is applied to the first electromagnetic coil actuator 120, and a negative polarity control signal is applied to the second electromagnetic coil actuator 121. The positive polarity control signal on the first electromagnetic coil actuator assembly creates a first force 123 on the carriage in a positive X direction, away from the first coil assembly. The negative polarity control signal on the second electromagnetic coil actuator assembly creates a second force 122 on the carriage in a positive X direction, towards the second coil assembly. This results in a net displacement of the carriage in a positive X direction in response to the first and second forces.

Figure 5B:
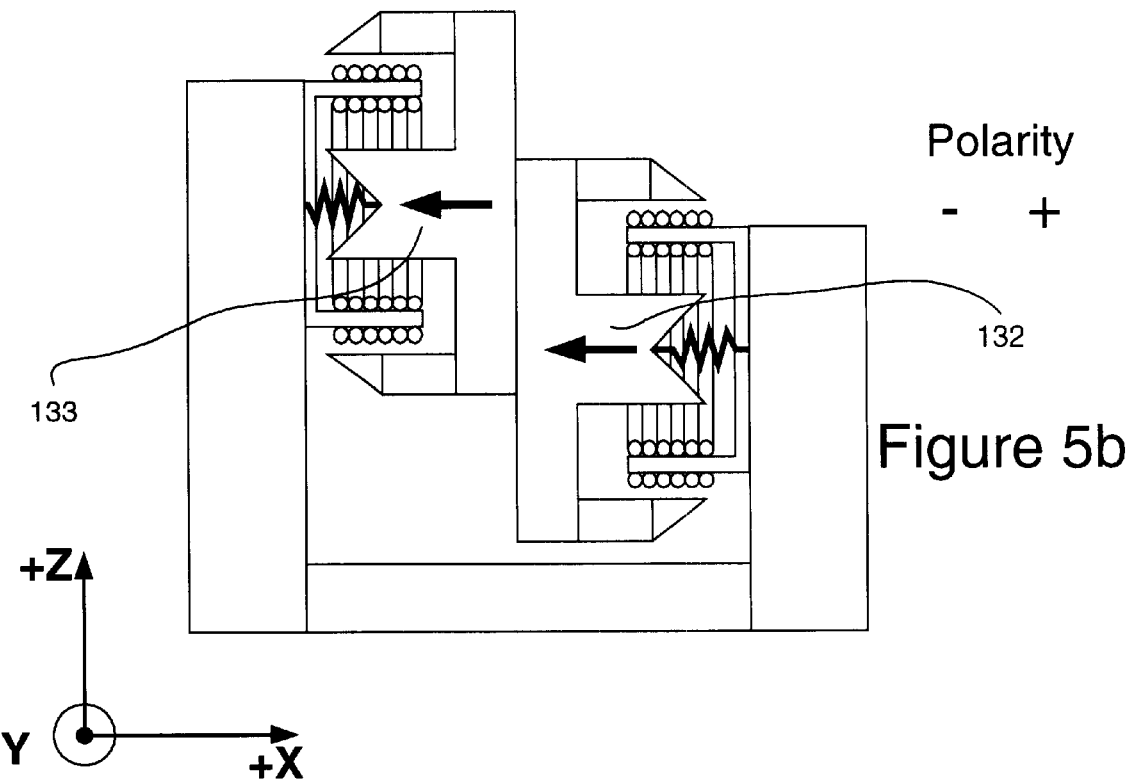

In FIG. 5b, assuming two identical electromagnetic coil actuator assemblies as part of the alignment mechanism, a negative polarity control signal is applied to the first electromagnetic coil actuator 120, and a positive polarity control signal is applied to the second electromagnetic coil actuator 121. The negative control signal on the first electromagnetic coil actuator assembly creates a first force 133 on the carriage in a negative X direction, towards the first coil assembly. The positive polarity control signal on the second electromagnetic coil actuator assembly creates a second force 132 on the carriage in a negative X direction, away from the second coil assembly. This results in a net displacement of the carriage in a negative X direction in response to the first and second forces.

Figure 5C:
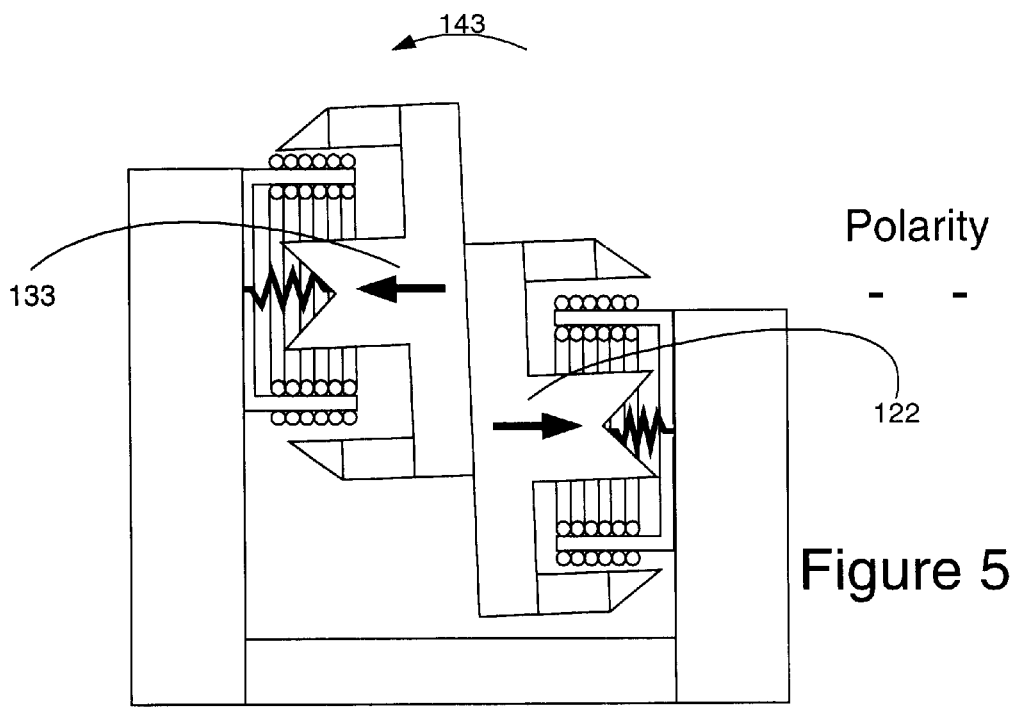
Figure 5D:
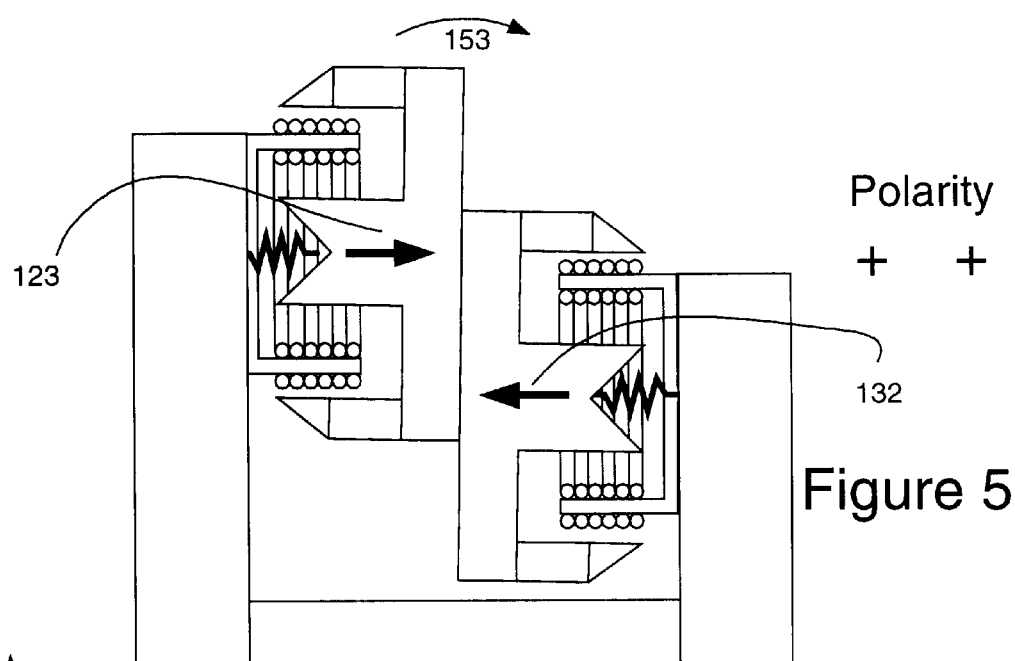

FIGS. 5c and 5d show rotations about the Y axes in dependence upon the control signal.

Using combinations of polarity and intensity of the control signal applied to each electromagnetic coil actuator results in a combination of translation and rotation of the carriage in response to the control signal. The portion of carriage within each gap limits the motion of the carriage within predetermined limits. Table 2 summarizes the resultant movement of the carriage in response to applied control signals to each of the electromagnetic coil actuators 120 and 121.

| Control Signal Polarity Applied to electromagnetic Coil Actuator | | |
| --- | --- | --- |
| 120 | 121 | Carriage Displacement |
| + | − | +X |
| − | + | −X |
| − | − | CCW about Y |
| + | + | CW about Y |

Table 2: Dual axis carriage movement in response to control signal polarity applied to each electromagnetic coil actuator as part of the dual axis alignment mechanism having electromagnetic coils fixed to a housing.

FIG. 6 details another possible mounting arrangement for a dual axis alignment mechanism comprising two electromagnetic coil actuator assemblies. The two magnetic stator assemblies are coupled together to a housing in a spaced relation, wherein the magnetic stator assemblies are beside each other along the X direction, having a same Z position, and in the Z-X plane. Two electromagnetic coil assemblies and carriage are also in spaced relation between the magnetic stator assemblies. Both electromagnetic coil assemblies are disposed along the X direction, with a same Z position and same Y position. The electromagnetic coil assembly is in a spaced relation to the magnetic stator assembly forming a gap therebetween, and a carriage is mounted to the at least two electromagnetic coil assemblies. The magnetic stator assemblies are mounted to a housing.

In FIG. 6a, assuming two identical electromagnetic coil actuator assemblies as part of the alignment mechanism, a positive polarity control signal is applied to the first electromagnetic coil actuator assembly 160, and a negative polarity control signal is applied to the second electromagnetic coil actuator assembly 161. The positive polarity control signal on the first electromagnetic coil actuator assembly creates a first force 163 on the carriage in a positive Z direction, away from the first stator assembly. The positive polarity control signal on the second electromagnetic coil actuator assembly creates a second force 163 on the carriage in a positive Z direction, away from the second stator assembly. This results in a net displacement of the carriage in a positive Z direction in response to the first and second forces.

In FIG. 6b, assuming two identical electromagnetic coil actuator assemblies as part of the alignment mechanism, a positive polarity control signal is applied to the first electromagnetic coil actuator assembly 160, and a positive polarity control signal is applied to the second electromagnetic coil actuator assembly 161. The positive polarity control signal on the first electromagnetic coil actuator assembly creates a first force 163 on the carriage in a positive Z direction, away from the first stator assembly. The negative polarity control signal on the second electromagnetic coil actuator assembly creates a second force 162 on the carriage in a negative Z direction, towards the second stator assembly. This results in a net rotation of the carriage in a clockwise (CW) direction about the Y-axis 93 in response to the first and second forces acting on the carriage.

FIG. 7 details another possible mounting arrangement for a dual axis alignment mechanism comprising of two electromagnetic coil actuator assemblies. The two electromagnetic coil assemblies are coupled together to a housing in a spaced relation, wherein the electromagnetic coil assemblies are beside each other along the X direction, having a same Z position, and in the Z-X plane. Two magnetic stator assemblies and carriage are also in spaced relation between the electromagnetic coil assemblies. Both magnetic stator assemblies are disposed along the X direction, with a same Z position and same Y position. The electromagnetic coil assembly is in a spaced relation to the magnetic stator assembly forming a gap therebetween, and a carriage is mounted to the at least two magnetic stator assemblies. The electromagnetic coil assemblies are mounted to a housing 183.

In FIG. 7a, assuming two identical electromagnetic coil actuator assemblies as part of the alignment mechanism, a positive polarity control signal is applied to the first electromagnetic coil actuator assembly 180, and a negative polarity control signal is applied to the second electromagnetic coil actuator assembly 181. The positive polarity control signal on the first electromagnetic coil actuator assembly creates a first force 184 on the carriage in a positive Z direction, away from the first electromagnetic coil assembly. The positive polarity control signal on the second electromagnetic coil actuator assembly creates a second force 184 on the carriage in a positive Z direction, away from the second electromagnetic coil assembly. This results in a net displacement of the carriage in a positive Z direction in response to the first and second forces.

In FIG. 7b, assuming two identical electromagnetic coil actuator assemblies as part of the alignment mechanism, a positive polarity control signal is applied to the first electromagnetic coil actuator assembly 180, and a positive polarity control signal is applied to the second electromagnetic coil actuator assembly 181. The negative polarity control signal on the first electromagnetic coil actuator assembly creates a first force 185 on the carriage in a negative Z direction, towards the first electromagnetic coil assembly. The negative polarity control signal on the second electromagnetic coil actuator assembly creates a second force 184 on the carriage in a positive Z direction, away from the second electromagnetic coil assembly. This results in a net rotation of the carriage in a counter clockwise (CCW) direction about the Y-axis 192 in response to the first and second forces acting on the carriage.

Combinations of dual axis optical component actuation mechanisms, as disclosed in FIGS. 5, 6 and 7, may be combined in a variety of fashions to obtain a single six axis optical component actuation mechanisms. Using stator assemblies and electromagnetic coil assemblies as part of the carriage results in a controllable six-axis alignment mechanism. Preferably, the carriage comprises the electromagnetic coil assemblies. Further preferably, the magnetic stator assemblies are part of the housing, which then results in a six-axis alignment mechanism with the greatest frequency response.

Figure 8:
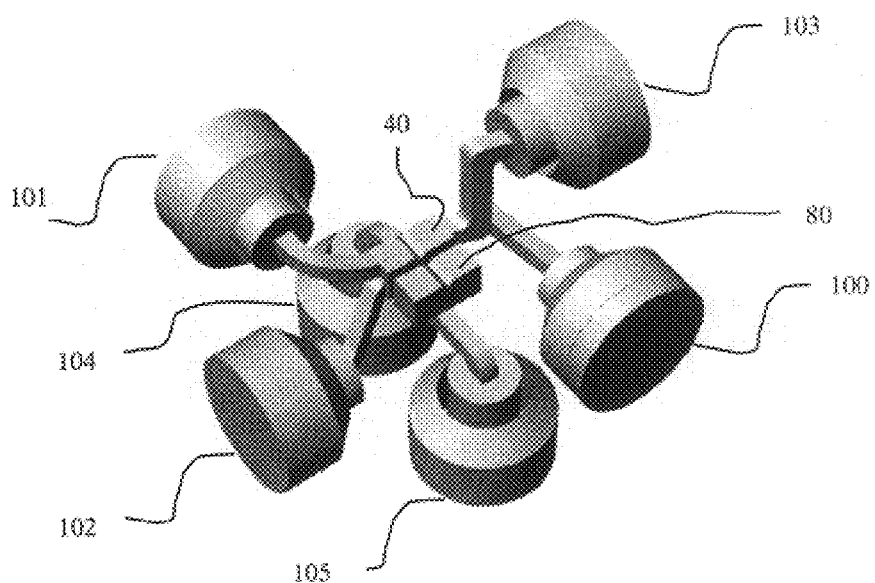
FIG. 8 is a CAD rendering of a preferred embodiment of the stators, coils and carriage.

Referring to FIG. 8, a CAD rendering of a preferred embodiment of the stators and coils and carriage is shown. At a center thereof is a mounting for an optical component to a portion of the carriage 40. A mount 80 fixed to a housing is provided for a second optical component. The housing is omitted for clarity.

In accordance with another embodiment of the invention, the actuator of the present invention is used for manual control of existing controllers such as remote controllers or for manipulating a control "dummy" for use in alignment of heavy or large objects.

The use of an actuator mechanism such as that described herein provides active alignment of components. Because of the dynamic nature of such a system, it allows for compensation of variations in alignment due to temperature changes, epoxy hardening, solder expansion, fusing processes, and other effects resulting during a process of affixing components.

Numerous other embodiments may be envisaged without departing from the spirit or scope of the invention.

What i claim is:

1. An alignment mechanism for aligning a component to a second other component comprising:
    at least two magnetic stator assemblies, each comprising a magnetic stator for providing a magnetic flux;
    at least two electromagnetic coil assemblies, each comprising an electromagnetic coil for interacting with the magnetic flux, the electromagnetic coil assembly in spaced relation to the magnetic stator forming a gap therebetween;
    a carriage for supporting the component, the carriage mounted to a first of two assemblies from the at least two electromagnetic coil assemblies and the at least two magnetic stator assemblies;
    a control circuit for providing a control signal to the electromagnetic coil to displace it a controllably variable distance relative to the magnetic stator assembly; and,
    wherein the carriage is controllably variably movable in rotation about a first axis and translation along a plane approximately normal to the first axis and approximately parallel to a second other axis for aligning of the component to the second other component mounted to a second of two assemblies, other than the first of two assemblies, from the at least two electromagnetic coil assemblies and the at least two magnetic stator assemblies.

2. An alignment mechanism as defined in claim 1 wherein the component is an optical component.

3. An alignment mechanism as defined in claim 2 wherein the stator assembly and an associated magnetic coil assembly form a voice coil.

4. An alignment mechanism as defined in claim 1 wherein the electromagnetic coil assemblies and electromagnetic stator assemblies are disposed within a same plane and offset one relative to the other along a dimension other than normal to the plane.

5. An alignment mechanism as defined in claim 4 wherein the carriage is fixedly mounted to the electromagnetic coil assemblies and is free to move relative to the magnetic stator assemblies.

6. An alignment mechanism as defined in claim 1 wherein the carriage is mounted to the electromagnetic coil assemblies and is free to move relative to the magnetic stator assemblies.

7. An alignment mechanism as defined in claim 1 wherein the carriage is mounted to the magnetic stator assemblies and is free to move relative to the magnetic coil assemblies.

8. An alignment mechanism as defined in claim 1 wherein the carriage is fixedly mounted to the magnetic stator assemblies.

9. An alignment mechanism as defined in claim 1 comprising:
   four further magnetic stator assemblies each comprising a magnetic stator for providing a magnetic flux;
   four further electromagnetic coil assemblies each comprising an electromagnetic coil for interacting with the magnetic flux, the electromagnetic coil assemblies each in spaced relation to a magnetic stator of the four further magnetic stator assemblies forming a gap therebetween;
   wherein the carriage is mounted to each of the four further electromagnetic coil assemblies;
   a control circuit for providing a control signal to the electromagnetic coil to displace it relative to the stator assembly within the gap a controllable distance; and,
   whereby the carriage is controllably movable with six degrees of freedom.

10. An alignment mechanism as defined in claim 1 comprising:
    four further magnetic stator assemblies each comprising a magnetic stator for providing a magnetic flux;
    four further electromagnetic coil assemblies each comprising an electromagnetic coil for interacting with the magnetic flux, the electromagnetic coil assemblies each in spaced relation to a magnetic stator of the four further magnetic stator assemblies forming a gap therebetween;
    wherein the carriage is mounted to each of the four further electromagnetic stator assemblies;
    a control circuit for providing a control signal to the electromagnetic coil to displace it relative to the stator assembly a controllable distance; and,
    whereby the carriage is controllably movable with six degrees of freedom.

11. An alignment mechanism as defined in claim 1 wherein the carriage is rotatable about the first axis within predetermined angular limits in dependence upon the gap between at least a magnetic stator assembly and an electromagnetic coil assembly.

12. An alignment mechanism as defined in claim 11, wherein the magnetic stator assembly comprises a magnet disposed about the electromagnetic coil for distrubuting and substantially uniform magnetic field within the fluid gap.

13. An alignment mechanism as defined in claim 12, wherein the electromagnetic coil and magnetic stator assembly are for generating a force on the carriage parallel to a predetermined axis of translation in response to the applied control signal.

14. An alignment mechanism as defined in claim 1 wherein the gap is a fluid gap.

15. An alignment mechanism as defined in claim 1 wherein the carriage is fixedly mounted to the two assemblies.

16. An alignment mechanism as defined in claim 1 wherein the carriage is flexibly mounted to the two assemblies.

17. An alignment mechanism as defined in claim 1, wherein the optical component, carriage and electromagnetic coil are capable of high frequency response at a frequency between 500 Hz to 30 kHz.

18. An alignment mechanism as defined in claim 1, wherein the carriage is provided with additional support for supporting the mass of the carriage.

19. An alignment as defined in claim 1 wherein the magnetic coils are oriented such that applying the control signal to a first electromagnetic coil from the two electromagnetic coils results in a displacement of the carriage in a first direction resulting in a displacement of a second other electromagnetic coil from the two electromagnetic coils.

20. A method of positioning a component in a rotational direction about a first axis and in a translational direction parallel to a second other axis, comprising the step of:
    varying the intensity and polarity of a control signal applied to each of a pair of electromagnetic actuators having one of an electromagnetic coil and a magnetic stator assembly coupled to a same carriage at two different locations thereon to control the magnitude and direction of displacement of the carriage along the second other axis and to control the magnitude and direction of rotation of the carriage about the first axis wherein the displacement and rotation is relative the other one of an electromagnetic coil and a magnetic stator assembly from the pair of electromagnetic actuators.

21. A method of positioning a component as defined in claim 20, comprising a step of:
    applying a polarized control signal of a polarity to a first electromagnetic actuator having one of an electromagnetic coil and one of a magnetic stator assembly coupled to the carriage to effect movement of the carriage in a first direction; and,
    applying a polarized control signal of a polarity to a second electromagnetic actuator having one of an electromagnetic coil and one of a magnetic stator assembly coupled to the carriage to effect movement thereof in a same first direction resulting in a translation displacement of the component in an axis.

22. A method of positioning a component as defined in claim 21, comprising a step of:
    applying a polarized control signal of a polarity to a first electromagnetic actuator having on of an electromagnetic coil and one of a magnetic stator assembly coupled to the carriage to effect movement of the carriage in a first direction; and,
    applying a polarized control signal of a polarity to a second electromagnetic actuator having one of an electromagnetic coil and one of a magnetic stator assembly coupled to the carriage to effect movement thereof in direction opposite to the first direction resulting in a rotational displacement of the component about an axis.

23. A method of positioning a component in a plurality axes as defined in claim 22 wherein the combination of the translational and rotational displacements, in combination with four additional electromagnetic actuators, provides six degrees of freedom to the carriage within predetermined limits.

24. A method of positioning a component as defined in claim 21, wherein the electromagnetic coils are magnetically coupled to the carriage assembly.

25. A method of positioning a component as defined in claim 20 wherein the component is an optical component.

26. A method of positioning a component as defined in claim 25 wherein the optical component is an optical fibre.

* * * * *